United States Patent
Marendic et al.

(10) Patent No.: US 12,237,668 B2
(45) Date of Patent: Feb. 25, 2025

(54) FAST FAULT DETECTOR

(71) Applicant: S&C Electric Company, Chicago, IL (US)

(72) Inventors: Boris Marendic, Chicago, IL (US); Yoav Sharon, Evanston, IL (US); John Seuss, Washington, DC (US)

(73) Assignee: S&C Electric Company, Chicago, IL (US)

( * ) Notice: Subject to any disclaimer, the term of this patent is extended or adjusted under 35 U.S.C. 154(b) by 155 days.

(21) Appl. No.: 18/113,654

(22) Filed: Feb. 24, 2023

(65) Prior Publication Data

US 2023/0291198 A1 Sep. 14, 2023

Related U.S. Application Data

(60) Provisional application No. 63/318,241, filed on Mar. 9, 2022.

(51) Int. Cl.
| | | |
|---|---|---|
| *H02H 7/00* | (2006.01) | |
| *G01R 19/165* | (2006.01) | |
| *H02H 1/00* | (2006.01) | |
| *H02H 7/22* | (2006.01) | |

(52) U.S. Cl.
CPC ......... *H02H 7/22* (2013.01); *G01R 19/16571* (2013.01); *H02H 1/0007* (2013.01)

(58) Field of Classification Search
None
See application file for complete search history.

(56) References Cited

U.S. PATENT DOCUMENTS

| | | | | |
|---|---|---|---|---|
| 5,701,080 A | * | 12/1997 | Schumacher | H02H 1/0092 324/115 |
| 5,943,246 A | * | 8/1999 | Porter | H02H 3/207 307/64 |
| 8,031,447 B2 | * | 10/2011 | Guzman-Casillas | H02H 7/045 361/93.1 |
| 11,719,736 B2 | * | 8/2023 | Marendic | H02H 3/042 361/62 |
| 2008/0024142 A1 | | 1/2008 | Opfer et al. | |
| 2010/0073830 A1 | * | 3/2010 | Schweitzer, III | H02H 1/0023 356/218 |

(Continued)

OTHER PUBLICATIONS

International Search Report and Written Opinion for International Application No. PCT/US2023/14576 dated May 25, 2023. (13 pages).

*Primary Examiner* — Stephen W Jackson

(57) ABSTRACT

A system and method for estimating fault current using a sliding observation window that is shorter than one cycle. The method may also include providing a pickup level that defines a current threshold for opening a switch in response to detecting the fault current; estimating the fault current from current measurement signals; accumulating time from a reset zero position during the time that the estimation of the fault current is greater than the pickup level; subtracting time from the accumulated time during the time that the estimation of the fault current is less than the pickup level after time has been accumulated from when the estimation of the fault current is greater than the pickup level; detecting the fault current if the accumulated time reaches a predetermined accumulation time; and opening the switch if the fault current is detected.

17 Claims, 2 Drawing Sheets

(56) References Cited

U.S. PATENT DOCUMENTS

| | | |
|---|---|---|
| 2012/0306411 A1 | 12/2012 | Tadano |
| 2013/0135907 A1 | 5/2013 | Oi et al. |
| 2019/0245343 A1* | 8/2019 | Porter .................... G01R 19/02 |
| 2021/0075209 A1 | 3/2021 | Wahlroos et al. |
| 2021/0075210 A1 | 3/2021 | Wahlroos et al. |

* cited by examiner

FAST FAULT DETECTOR

CROSS-REFERENCE TO RELATED APPLICATION

This application claims the benefit of priority from the U.S. Provisional Application No. 63/318,241, filed on Mar. 9, 2022, the disclosure of which is hereby expressly incorporated herein by reference for all purposes.

BACKGROUND

Field

The present disclosure relates to a system and method for estimating fault current using a sliding observation window.

Discussion of the Related Art

An electrical power distribution network, often referred to as an electrical grid, typically includes power generation plants each having power generators, such as gas turbines, nuclear reactors, coal-fired generators, hydro-electric dams, etc. The power plants provide power at medium voltages that are then stepped up by transformers to a high voltage AC signal to be connected to high voltage transmission lines that deliver electrical power to substations typically located within a community, where the voltage is stepped down to a medium voltage for distribution. The substations provide the medium voltage power to three-phase feeders. three-phase and single phase lateral lines are tapped off of the feeder that provide the medium voltage to various distribution transformers, where the voltage is stepped down to a low voltage and is provided to loads, such as homes, businesses, etc. These power distribution networks typically include switching devices, breakers, reclosers, interrupters, etc. that control the flow of power throughout the network. A vacuum interrupter is a switch that has particular application for many of these types of devices.

Periodically, faults occur in the distribution network as a result of various events, such as animals touching the lines, lightning strikes, tree branches falling on the lines, vehicle collisions with utility poles, etc. Faults may create a short-circuit that increases the stress on the network, which may cause the current flow from the substation to significantly increase, for example, many times above the normal current, along the fault path. This amount of current causes the electrical lines to significantly heat up and possibly melt, and also could cause mechanical damage to various components in the substation and in the network. These faults are many times transient or intermittent faults as opposed to a persistent or bolted fault, where the cause of the fault is naturally gone a short time after the fault occurs, for example, a lightning strike. In such cases, the distribution network will almost immediately begin operating normally after a brief disconnection from the source of power.

Fault interrupters, for example, reclosers that employ vacuum interrupters, are provided on utility poles and in underground circuits along a power line and have a switch to allow or prevent power flow downstream of the recloser. These reclosers detect the current and voltage on the line to monitor current flow and have controls that indicate problems with the network circuit, such as detecting a high current fault event. If such a high fault current is detected the recloser is opened in response thereto, and then after a short delay closed to determine whether the fault is a transient fault. If a high fault current flows when the recloser is closed after opening, it is immediately re-opened. If the fault current is detected a second time, or multiple times, during subsequent opening and closing operations indicating a persistent fault, then the recloser remains open, where the time between detection tests may increase after each test.

During the traditional reclosing operation discussed above, the vacuum interrupter contacts in the recloser are closed without regard to a desired phase angle. This results in a random closing angle that often creates an asymmetrical fault current, where the current cycle is offset from zero, i.e., has high magnitude peaks in one polarity and lower peaks in the reverse polarity relative to zero. The high magnitude fault current peaks, depending on the length of time they are occurring, causes significant forces and stresses on the components in the network that may reduce their life. For the traditional reclosing operation these forces and stresses can be considerable. When considering the life of a transformer winding, one cause of end of life can be fatigue in the winding, which is the accumulation of high mechanical and thermal stress cycles. Stress is the result of the current in the winding, where higher current results in higher stress. Doubling the stress that can cause fatigue from the asymmetrical fault currents described above can result in a tenfold or more reduction in fatigue life, i.e., the life before fatigue causes cracking. This stress can be reduced by reducing the peak current and by reducing the number of stress cycles.

In order to overcome this problem, reclosers have been developed in the art that use pulse testing technologies where the closing and then opening of the vacuum interrupter contacts is performed in a pulsed manner so that the full fundamental frequency multiple cycle fault current is not applied to the network while the recloser is testing to determine if the fault is still present. Typically these pulses are about one-half of a fundamental frequency current cycle. Additionally, these reclosers close at the appropriate point on the voltage waveform to eliminate the asymmetrical current, which reduces the stresses due to high current in the components.

The traditional fault detection scheme is to trigger a fault detection, i.e., issue a trip command, as soon as a current estimator calculates the current to be above a predefined pickup level that identifies when the fault current should be interrupted for the instantaneous element, as opposed to definite time or time current characteristic (TCC) elements. However, any estimator of this kind, such as a 1-cycle discrete Fourier transform (DFT), exhibits some overshoot, where the current goes above the pickup level, but then immediately goes below it, which can trigger false fault detections at current levels lower than the predefined pickup level.

SUMMARY

The following discussion discloses and describes a system and method for estimating fault current using a sliding observation window that is shorter than one cycle. The method may further include providing a pickup level that defines a current threshold for opening a switch in response to the fault current, estimating current in the power system from current measurement signals, accumulating time from a reset zero position during the time that the estimation of the current is greater than the pickup level, and subtracting time from the accumulated time during the time that the estimation of the current is less than the pickup level after time has been accumulated from when the estimation of the current is greater than the pickup level. Fault current is detected if the accumulated time reaches a predetermined accumulation time, and a switch is opened.

Additional features of the disclosure will become apparent from the following description and appended claims, taken in conjunction with the accompanying drawings.

DETAILED DESCRIPTION OF THE EMBODIMENTS

The following discussion of the embodiments of the disclosure directed to a system and method for estimating fault current using a sliding observation window that is shorter than one cycle is merely exemplary in nature, and is in no way intended to limit the invention or its applications or uses.

Figure 1:
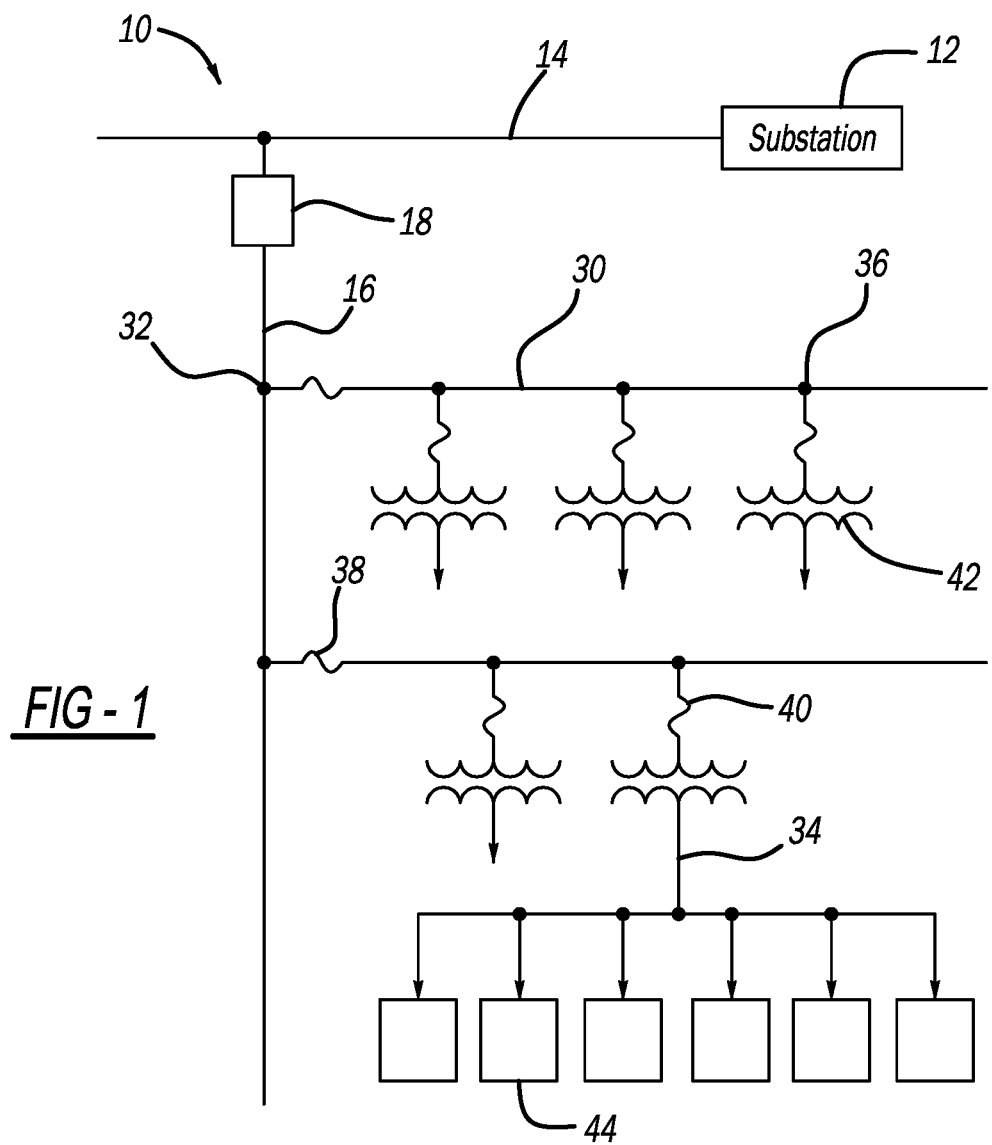
FIG. 1 is a simplified schematic illustration of an electrical power distribution network.
Figure 2:
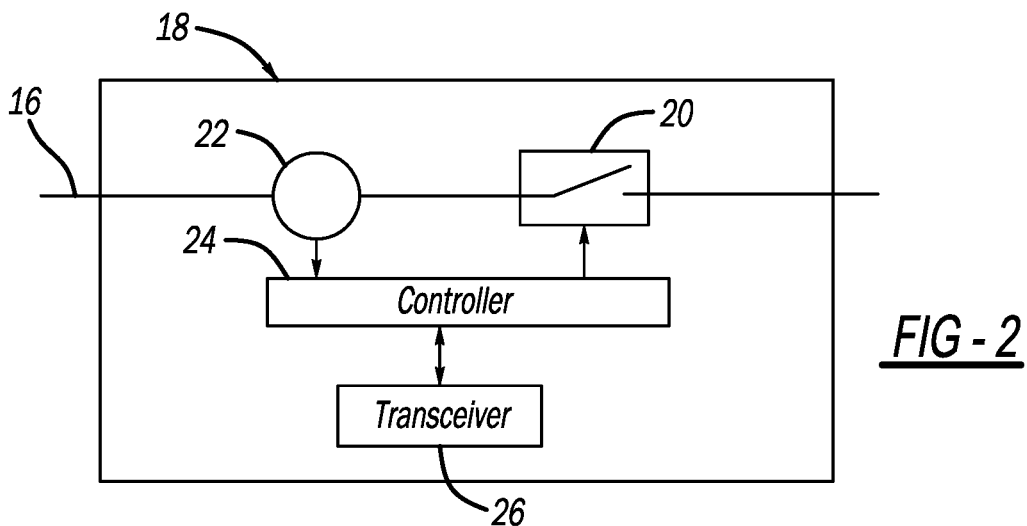
FIG. 2 is a simplified block diagram of a recloser used in the network shown in FIG. 1.

FIG. 1 is a schematic type diagram of an electrical power distribution network 10 including an electrical substation 12 that steps down high voltage power on a high voltage power line (not shown) to medium voltage power, such as 12.47 kV, provided on a substation bus 14. A three-phase feeder 16 is connected to the bus 14 and a recloser 18 is provided proximate to the connection point between the feeder 16 and the bus 14. The recloser 18 is intended to represent any reclosing or fault interrupting device suitable for the purposes described herein. FIG. 2 is a simplified block diagram of a representative example of the recloser 18, and includes a vacuum interrupter 20 for opening and closing the recloser 18 to allow or prevent current flow therethrough on the feeder 16, sensors 22 for measuring the current and/or voltage of the power signal propagating on the feeder 16, a controller 24 for processing the measurement signals and controlling the position of the vacuum interrupter 20, and a transceiver 26 for transmitting data and messages to a control facility (not shown) and/or to other reclosers and components in the network 10.

The network 10 includes single-phase lateral lines 30 coupled to the feeder 16 usually at a utility pole 32 and a secondary service lines 34 coupled to each lateral line 30 usually at a utility pole 36, where a lateral fuse 38 is provided at the connection point between each lateral line 30 and the feeder 16 and a primary fuse 40 is provided at the connection point between each lateral line 30 and each service line 34. A distribution transformer 42 is provided at the beginning of each service line 34 that steps down the voltage from the medium voltage to a low voltage to be provided to loads 44, such as homes.

This disclosure proposes a current estimator and an overcurrent detection and protection algorithm operating, for example, in the controller 24 that is similar to the traditional 1-cycle DFT current estimation method that may use the time derivative of the current waveform or the current waveform. The estimator uses a parametric method, which means that the observed waveform is modeled, and the parameters of the model are estimated that best fit the model to the observed waveform. The algorithm uses a sliding observation window that is shorter than one cycle, such as ¼-cycle, which may cause the estimator to produce larger overshoots, such as greater than 10%. The amount of overshoot depends on the validity of simplifying assumptions, such as a large X/R ratio, where the X/R ratio is the ratio of total inductive impedance X (that comes from that net inductance L) to the total resistive impedance R along the fault path, and may thus trigger false fault detections at current levels lower than the predetermined pickup level. In order to reduce the false detections, the detection algorithm employs two mechanisms, namely, a time-delay qualifier and a no-delay threshold that are described in detail below. It is noted that the time-delay mechanism described herein is not used for purposes of coordination in the context of this disclosure, which typically use delays in protection, but for security reasons, to reduce the probability of false detections.

Assuming that the current in a conductor is i(t), and using the standard model of a fault, the instantaneous current is modeled as:

$$i(t) = \sqrt{2} I_{rms} \cdot \cos(2\pi ft + \theta) + A_{DC} \cdot e^{-\frac{t}{T}} + N(t), \quad (1)$$

where f is the system frequency (50 Hz or 60 Hz), $\sqrt{2}I_{rms} \cos(2\pi ft+\theta)$ is the system power current, $$A_{DC} \cdot e^{-\frac{t}{T}}$$

is the decaying DC component and N(t) represents other nuisance components such as harmonics, switching or other transients, and sensor noise. In general, noise is produced by active components such as A/D converters, amplifier stages in the conditioning circuits, filters and other electronic components. The constant T is the decaying time constant dependent on the X/R ratio of the circuit during the fault. It is assumed at this point that the system frequency f is known a priori. The frequency is assumed to be stable at the system frequency or is tracked independently by an external algorithm.

If the sensors 22 do not directly measure the current waveform itself, but the time derivative of the current, then the observed waveform di/dt (t) has a form of:

$$di/dt(t) = 2\pi f \cdot \sqrt{2} I_{rms} \cdot \sin(2\pi ft + \theta) - \frac{A_{DC}}{T} \cdot e^{-\frac{t}{T}} + N'(t). \quad (2)$$

Note that after differentiation, the form of equation (2) is the same as equation (1) except for the scaling factors, and the nuisance term N(t) is differentiated into N'(t). During a fault, it is reasonable to assume that the nuisance parameter N(t) or N'(t) is negligibly small because the current magnitude is very large. In documenting and illustrating the algorithm in the discussion below, the time derivative of the current waveform is used, but the process applies equally to the waveforms that are the current itself.

The proposed algorithm estimates the model parameters by processing sampled waveform data, sampled at frequency $F_s$ and denoted from this point onward as $x_k \triangleq x(t_k)$, where $t_k = k/F_s$, using a moving window containing N samples. It achieves fast fault detection by operating with a sampling window that is shorter than one full cycle, such as ¼ cycle. For a window that is a fraction of one cycle, it is assumed that the amount of decay in one such processing window is negligibly small. In general, this assumption holds well for large X/R ratios, and worsens as X/R ratios decrease. Much like the effect of decay is considered negligibly small, so is the effect of the average DC offset within the processing window. Taking these assumptions into consideration, it is clear that the simplified model obtains an approximation to the true waveform, which is denoted as x(k). Using the definitions introduced above, the final model has the form:

$$\tilde{x}(k) = A\cos(2\pi Fk) + B\sin(2\pi Fk), \quad (3)$$

where the model has two unknown parameters, namely, amplitudes A and B of the cos(•) and sin(•) components.

Digital frequency F is defined as the ratio of the system frequency and the sampling frequency as $F = f/F_s$. Once these two components are known, the desired quantities can be computed as:

$$I_{rms} = 1/2\sqrt{2}\pi f\sqrt{A^2 + B^2}, \quad (4)$$

$$\theta = \tan^{-1}(B/A). \quad (5)$$

The model in equation (4) can be represented as an N component vector because the moving observation window has N samples, and can thus be written in the matrix-vector form $\vec{\tilde{x}} = A\vec{p}$. Vector $\vec{p}$ is a two-component vector such that $p_1 = A$ and $p_2 = B$. Since the model is an approximation to the true observation $x_k$, the relationship between $x_k$ and $\tilde{x}(k)$ can be written as $x_k = \tilde{x}(k) + \varepsilon(k)$, where $\varepsilon(k)$ represents the unknown errors between the measurement and the model at instance $t_k$. In vector notation, and using the definition for $\tilde{x}(k)$ from above, the relationship becomes:

$$\vec{x} = A\vec{p} + \vec{\varepsilon}, \quad (6)$$

where the quantities A and $\vec{x}$ are:

$$\vec{x} = \begin{bmatrix} x_k \\ x_{k+1} \\ \vdots \\ x_{k+N-2} \\ x_{k+N-1} \end{bmatrix}, \quad (7)$$

$$A = \begin{bmatrix} \cos(2\pi ft_k) & \sin(2\pi ft_k) \\ \cos(2\pi ft_{k+1}) & \sin(2\pi ft_{k+1}) \\ \vdots & \vdots \\ \cos(2\pi ft_{k+N-2}) & \sin(2\pi ft_{k+N-2}) \\ \cos(2\pi ft_{k+N-1}) & \sin(2\pi ft_{k+N-1}) \end{bmatrix}. \quad (8)$$

From the definition above it follows that $x_k$ is the earliest sample in the current window, and $x_{k+N-1}$ is the most recent sample in the window. The optimal vector $\vec{p^*}$ is solved to minimize the total error between $\vec{x}$ and $\tilde{x}$ as:

$$\vec{p_*} = \min_{\vec{p}} \sum_{k=0}^{N-1} |\varepsilon(k)|^2. \quad (9)$$

This formulation is a least-squares problem for which the classic solution is $\vec{p^*} = (A^T A)^{-1} A^T \vec{x}$. This solution is easily implemented with a microprocessor in a digital relay. To simplify the implementation, the matrix $[(A^T A)^{-1} A^T]$ can be precomputed, processed and stored using timestamps $$t_k, t_{k+1}, t_{k+2}, \ldots, t_{k+N-2}, t_{k+N-1} = 0, \frac{1}{F_s}, \frac{2}{F_s}, \ldots, \frac{N-2}{F_s}, \frac{N-1}{F_s}.$$

The time-delay qualifier referred to above is an integrator of time that works with a prescribed delay, and starts integrating when the current estimator first detects a current magnitude that crosses a predefined pickup level. This process of detection can be described using a rotating disk analogy that spins in one direction (positive, clockwise) when the current estimator is above the pickup level, and the other direction (negative, counterclockwise) when the current estimator is below the pickup level. The disk starts spinning from a reset zero position when the current estimator reaches the pickup level the first time, and detects a fault when current estimator reaches a predefined position governed by the predefined delay period.

Figure 3:
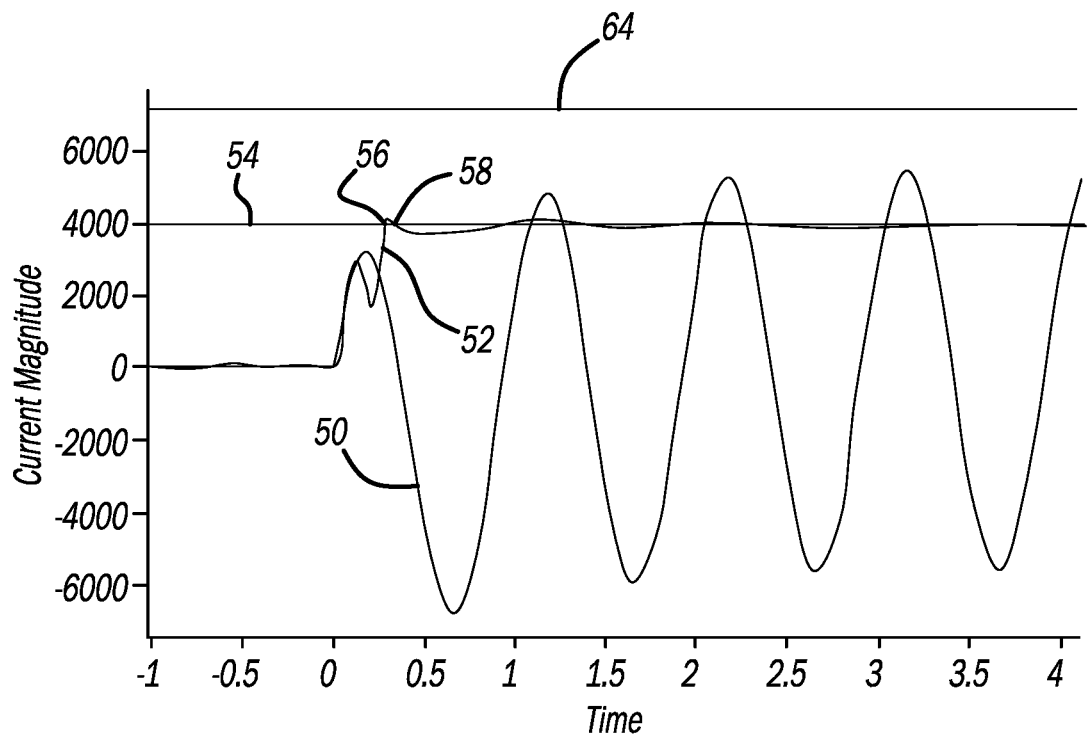
FIG. 3 is a graph with time on the horizontal axis and current magnitude on the vertical axis showing start of a fault.

FIG. 3 is a graph with time on the horizontal axis and current magnitude on the vertical axis showing a fault scenario and illustrating the time-delay qualifier discussed above. Waveform 50 is fault current, curve 52 is the RMS current estimate from the current estimator and line 54 is the pickup level that identifies when the vacuum interrupter 20 should open because of the fault current. In one example, the current estimator samples the current 128 times per current cycle and estimates the fault current in a manner so that it overshoots the pickup level a couple of times before settling below the pickup level. Thus, since the actual RMS fault current did not exceed the pickup level, the vacuum interrupter 20 should not be triggered open. However, for the traditional system, the vacuum interrupter 20 would be triggered open when the current estimator estimated the current above the pickup level during the first overshoot.

Figure 4:
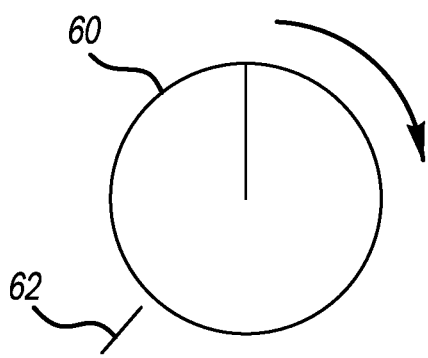
FIG. 4 is a timing disc turning in a positive direction for accumulating time.
Figure 5:
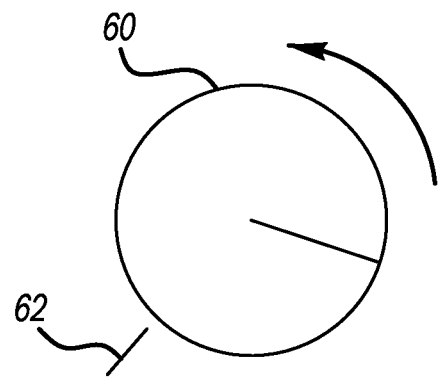
FIG. 5 is a timing disc turning in a negative direction for removing time.

FIG. 4 illustrates a timing disk 60 positioned at an initial or vertical reset position that occurs before the fault current is detected. The current estimator as described above first estimates the fault current to go above the pickup level at a 0.3-cycle point at point 56. Instead of detecting a fault and opening the vacuum interrupter 20 as soon as the current estimate reaches the pickup level at the point 56, the fault detection algorithm starts integrating time while the current estimate is above the pickup level. As the detection algorithm integrates time when the current estimate is above the pickup level, the disk 60 rotates in a clockwise or positive direction, as shown in FIG. 4. Since the current estimate goes above the pickup level at the start, the disk 60 starts rotating in the positive direction from the reset zero position. If the current estimate goes below the pickup level, such as at point 58, the detection algorithm subtracts time from the already accumulated time while the current estimate is below the pickup level. This is illustrated in FIG. 5 where the disk 60 is shown rotating in a counter-clockwise or negative direction from a point where some time has been accumulated from the current estimate being above the pickup level. When the current estimator drops below the pickup level, the disk 60 spins in the negative direction, but it stops if it reaches the reset zero position. A certain time accumulation threshold value is used for each system that provides a point where the estimate of the fault current indicates that the actual fault current is above the pickup level, which is illustrated by line 62. This functionality can be implemented in software using an integrator.

Additionally, a no-delay threshold line 64 is provided at the maximum overshoot level above the pickup level, which is a parameter specified as a percentage above the pickup level, for example, in the range of 1%-100%. If the current estimator estimates the fault current to be above the no-delay threshold, a fault is detected instantaneously because this level could not be reached by overshoot from the current level that is below the pickup level. Using the no-delay threshold mechanism speeds up the detection process in cases when the true current level is much higher than the pickup level.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A method for estimating current in a power system, the method comprising:
    providing a pickup level that defines a current threshold for opening a switch in response to overcurrent; and
    estimating current in the power system from current measurement signals, wherein estimating the current is performed using a sliding observation window that is shorter than one cycle, wherein estimating current in the power system includes using observation windows that are about one-quarter of a current cycle.

2. The method according to claim 1 further comprising:
    accumulating time from a reset zero position during the time that the estimation of the current is greater than the pickup level;
    subtracting time from the accumulated time during the time that the estimation of the current is less than the pickup level after time has been accumulated from when the estimation of the current is greater than the pickup level;
    detecting the overcurrent if the accumulated time reaches a predetermined accumulation time; and
    opening the switch if the overcurrent is detected.

3. The method according to claim 2 wherein subtracting time from the accumulated time includes stopping subtracting time if the accumulated time reaches the reset zero position.

4. The method according to claim 2 further comprising providing a no-delay threshold that defines a current threshold above the pickup level, wherein detecting the overcurrent includes immediately detecting the overcurrent if the estimated current goes above the no-delay threshold.

5. The method according to claim 4 wherein the no-delay threshold is in the range of 1%-100% greater than the pickup level.

6. The method according to claim 1 wherein the switch is part of a recloser.

7. The method according to claim 6 wherein the recloser employs pulse closing technologies.

8. The method according to claim 1 wherein estimating current in the power system includes using the time derivative of the current.

9. The method according to claim 1 wherein estimating current in the power system includes modeling the current as:

$$\tilde{x}(k) = A\cos(2\pi Fk) + B\sin(2\pi Fk),$$

where $\tilde{k}(k)$ is the current waveform, F is the ratio of system frequency and sampling frequency, k is sample time, and A and B are unknown amplitudes.

10. A method for estimating current in a power system, the method comprising:
    providing a pickup level that defines a current threshold for opening a switch in response to the overcurrent;
    estimating current in the power system from current measurement signals;
    accumulating time from a reset zero position during the time that the estimation of the current is greater than the pickup level;
    subtracting time from the accumulated time during the time that the estimation of the current is less than the pickup level after time has been accumulated from when the estimation of the current is greater than the pickup level;
    detecting the overcurrent if the accumulated time reaches a predetermined accumulation time; and
    opening the switch if the overcurrent is detected, wherein estimating current in the power system includes using a sliding observation window that is shorter than one cycle.

11. The method according to claim 10 wherein subtracting time from the accumulated time includes stopping subtracting time if the accumulated time reaches the reset zero position.

12. The method according to claim 10 further comprising providing a no-delay threshold that defines a current threshold above the pickup level, wherein detecting the overcurrent includes immediately detecting the overcurrent if the estimated current goes above the no-delay threshold.

13. The method according to claim 12 wherein the no-delay threshold is in the range of 1%-100% greater than the pickup level.

14. A system for protecting a power system from overcurrent, the system comprising:
    means for providing a pickup level that defines a current threshold for opening a switch in response to the overcurrent; and
    means for estimating current in the power system from current measurement signals, wherein the means for estimating the current uses a sliding observation window that is shorter than one cycle, wherein the means for estimating current in the power system uses observation windows that are about one-quarter of a current cycle.

15. The system according to claim 14 further comprising:
    means for accumulating time from a reset zero position during the time that the estimation of the current is greater than the pickup level;
    means for subtracting time from the accumulated time during the time that the estimation of the current is less than the pickup level after time has been accumulated from when the estimation of the current is greater than the pickup level;
    means for detecting the overcurrent if the accumulated time reaches a predetermined accumulation time; and
    means for opening the switch if the overcurrent is detected.

16. The system according to claim 15 wherein the means for subtracting time from the accumulated time stops subtracting time if the accumulated time reaches the reset zero position.

17. The system according to claim 15 further comprising means for providing a no-delay threshold that defines a current threshold above the pickup level, wherein the means for detecting the overcurrent immediately detects the overcurrent if the estimated current goes above the no-delay threshold.

* * * * *